United States Patent

Journot

[11] 4,052,799
[45] Oct. 11, 1977

[54] MANUALLY INDEXED VISUAL TEST RECORDING APPARATUS

[76] Inventor: Vida M. Journot, 73 Stonegate Drive, Bedford, Tex. 76021

[21] Appl. No.: 561,917

[22] Filed: Mar. 25, 1975

[51] Int. Cl.² .................... G09B 7/00; H03K 21/18
[52] U.S. Cl. ................................ 35/48 R; 35/8 R; 235/92 EA
[58] Field of Search ............... 35/1, 5, 8 R, 9 R, 9 A, 35/9 B, 9 D, 11 R, 35 C, 48 R, 48 B; 179/1 MN; 235/61.6 E, 154, 156, 92 CA, 92 CP, 92 SA, 92 EA; 324/68; 340/336

[56] References Cited

U.S. PATENT DOCUMENTS

| | | | |
|---|---|---|---|
| 2,564,089 | 8/1951 | Williams et al. | 35/9 B |
| 3,038,120 | 6/1962 | Bernstein et al. | 324/68 |
| 3,121,959 | 2/1964 | Uttal | 35/9 R |
| 3,186,109 | 1/1965 | Brinton | 35/9 B |
| 3,270,438 | 9/1966 | Ephraim | 35/5 |
| 3,300,877 | 1/1967 | Feder | 35/9 A |
| 3,350,793 | 11/1967 | Bushnell | 35/9 B |
| 3,390,397 | 6/1968 | Friedlander | 346/33 |
| 3,579,870 | 5/1971 | Bennett | 35/48 R |
| 3,656,243 | 4/1972 | Segal et al. | 35/48 B |
| 3,684,870 | 8/1972 | Nelson | 235/92 EA |
| 3,748,754 | 7/1973 | LaBerge | 35/48 R |

*Primary Examiner*—Richard C. Pinkham
*Assistant Examiner*—Vance Y. Hum
*Attorney, Agent, or Firm*—Charles W. McHugh

[57] ABSTRACT

An electronic speech therapy teaching apparatus for use by a speech therapist includes a silent timer with an associated electronic digital display, an adjustable aural speech rate device, an automatic calculator for computing a student's percentage of correct responses, an electronic display of the accumulation of total and correct responses, and controls to select and operate the various features of the apparatus. The silent timer selectively counts up or down, informing the operator when counting down, through an audio/visual alarm, when a predetermined time period has expired. The adjustable aural speech rate device produces tones at a rate appropriate for the speech student. Manually controlled switches enable the operator to register and display the number of correct and total responses during the evaluation procedure. An automatic computer calculates the percentage of a student's correct responses as they are registered by the operator.

21 Claims, 7 Drawing Figures

MANUALLY INDEXED VISUAL TEST RECORDING APPARATUS

This invention relates to equipment for use by speech therapists and the like in testing, evaluating and modifying the speech habits of those persons who are considered to have a speech handicap.

Among those extraordinary people who have frequently been neglected in times past have been those people who exhibited what is commonly called a speech handicap. This neglect has not always been intentional, because certainly there have been relatives and close friends, as well as professional people such as speech pathologists, etc., who have been very concerned about the welfare of such handicapped persons. But mere "concern" or "sympathy" by others usually has not been enough to make much difference in the speech habits of most persons; what has been needed has been hardware, instruments, programs and other tangible "tools" with which the handicapped can be helped. In particular, there has long been a dearth of equipment with which to evaluate a person's handicap with sufficient accuracy (and speed) so that a therapist could promptly begin constructive work with the person-without spending a lot of time in unfruitful exploration. For example, if a child has a handicap such that he continually stutters, it usually doesn't take an observer very long to discern this fact. And if that child who once stuttered has been helped to full speech fluency, it shouldn't take an observer too long to conclude that the problem has been solved. But, regrettably, there has not really existed any equipment with which to accurately evaluate performance somewhere between these two extremes, i.e., equipment which would permit a clinician to quickly say with assurance that a child is performing 10 or 15% better this week than he did last week. Neither has it been possible to demonstrate with empirical data that a given therapy program is more cost effective than another program because the first program repeatedly provides more improvement at a lower cost. Hence, it is believed that the absence of any specialized equipment for measuring speech abnormalities in a scientific manner has contributed to the prolongation of some rather laborious trial-and-error techniques in speech therapy that should have been abandoned (or at least drastically modified) long ago.

Too, in order to determine if a person with a speech handicap is being helped by a particular program of therapy, it is fairly obvious that tests should first be performed to find out what is the person's beginning level of speech capability. This initial testing of the degree of a person's specific speech errors is commonly referred to as establishing a baseline for the specified speech behavior of the client or "subject". Although it is so logical that a baseline or beginning point should be established at the inception of any program of therapy, until recently there were no widely accepted or standardized procedures which could be used by various clinicians throughout the country in order to evaluate the degrees of a person's speech errors. While each so-called expert in speech therapy usually had his or her preferred test routines and training techniques, there were essentially no empirical data for hundreds or thousands of different handicapped persons which might be useful in discovering which tests or training techniques seemed to be more reliable than others, or which therapy techniques seemed to be more beneficial than others and to which students. Hence, the lack of standardized instrumentation for monitoring the performance of different persons has tended to inhibit major progress in dealing with many difficulties in human speech.

Another way in which speech therapists have been ill-equipped and hence ill-prepared to perform a service is that they have not been able to ascertain within a minimal period of time whether or not a child's speech difficulty was modifiable. That is, therapists usually have not been able to tell with only minimal therapy whether a child's speech problem can be helped (with proper therapy) or whether it is probable that the defect will never respond to therapy. If the problem is not modifiable, and it is not promptly diagnosed as such, then a lot of valuable time can be wasted in trying to train a child to do something which he physicaly just cannot do.

While it is believed that the absence of specialized equipment for speech therapy has been a hinderance to clinicians, it is not meant to suggest that there have been no tools at all available in the past. Admittedly, there have been certain items which have been adapted for use in measuring speech behavior, but which were not originally designed for such tasks and therefore (in many cases) had characteristics that made them less than fully satisfactory. For example, most all clinicians have worked at some time or another with stop watches, finger-actuated mechanical counters, electric clocks, kitchen timers, metronomes, pencil and paper, etc.; each of these instruments and tools was initially designed for a use which was completely unrelated to speech therapy, and often such tools just would not meet the requirements for efficient speech therapy. For example, commercialy available timers (such as one might find offered in a department store for household use) do not measure time as precisely or as accurately as is needed for many types of speech testing, including the establishment of diadochokinetic rates and vocal-weightedness. The inaccuracy (and noise) of household timers could of course be avoided by using reliable stop watches of the type used in competition sporting events, etc.; but a clinician's activities with a handheld stop watch can sometimes be distracting to children who are being tested, such that their test resulting might not always be valid. In addition, behaviors which are inaudible cannot be counted if the clinician must watch a clock. Accordingly, it is an object of this invention to provide an instrument which is specifically designed for use in testing, evaluating and modifying the speech of those persons who have been considered to have a speech handicap.

A significant part of this invention is concerned with a silent clock or timer which is ideally suited for use by a speech clinician, in that it can be used to count time "up" from zero (in order to give the clinician a ready indication of elapsed time since a testing session began), or, by activation of a suitable switch, the timer may be used to count time "down" from a preset quantity (such as 5 or 15 minutes). When counting down, the expiration of the selected time period is usually announced in either of two ways: visually alone (as with a blinking light), or by the combination of a short noise from a buzzer together with a blinking light.

Another part of the unit comprises what will be referred to herein as an automatic percentage computer, which includes decimal counters for recording the number of correct and incorrect responses by the student being tested, individual judgement as to correctness is provided by either the clinician or the student. Two buttons (switches) are provided on the face of the unit, one of which is pressed when a correct response has been given and the other being pressed when an incorrect response has been given. A first decimal counter records only signals generated when the "correct" button has been pressed; a second decimal counter records signals which are generated by both the "correct" and "incorrect" buttons, and a third decimal counter also records signals which are generated by the both the "correct" and "incorrect" buttons, but it is cleared by a separate switch to enable the recording of the accumulation of all "correct" and "incorrect" responses when the first and second counters are reset. A digital display is provided on the face of the instrument to reveal the number of correct responses and/or the total number of responses that have been recorded, as well as a separate display for the accumulation of the total number of responses for some predetermined number of exercises. An additional readout is connected to circuitry which automatically divides the number of correct responses by the total number of responses, after each entry of a response into a memory bank; of course, this readout constitutes the percentage of correct answers—and it provides the clinician with an immediate report of performance by the student.

A third major part of the speech therapy unit constitutes an adjustable aural speech rate device that produces "beep" tones that are adjustably spaced to provide an appropriate "pace" for a stuttering student's speech in order to achieve complete fluency. The device includes not only a manual control for the rate at which pulse tones are generated, but it also includes a volume control so that the intensity of a "beep" tone can be optimized for each individual student. The pulse tones may be projected into a room through a loudspeaker incorporated into the unit, or privately provided to a headset worn by the student. This device constitutes a significant improvement over conventional metronomes, in that it makes it possible for a plurality of students to be working in the same room (with one speech therapy unit per student) under the supervision of a single clinician, and each student may be receiving—through his or her individual headset—a pulse tone of optimum intensity at an individually selected rate. While the clinician may be supervising the use of a variety of therapy programs in the room, neither she nor the students will be exposed to the confusion that would stem from a plurality of different "beep" tones being continually broadcast into the room.

While each of the three above-described sub-units of the speech therapy unit could be operated independently of the other sub-units, when they are combined in operation they tend to provide a synergistic effect that makes the unit described herein a significant contribution to the field of speech therapy. Hence, the unit will be described hereinafter as a composite unit in which all of the display means, switches, controls, power supplies, etc., are physically contained in one housing—because this is the preferred embodiment of the invention; but it should be understood that fragmenting the various devices into separate housings would be feasible.

Accordingly, the scope of the invention should be measured only in terms of the claims appended hereto, with such reference as is appropriate to the specification and the drawings, wherein:

Figure 1:
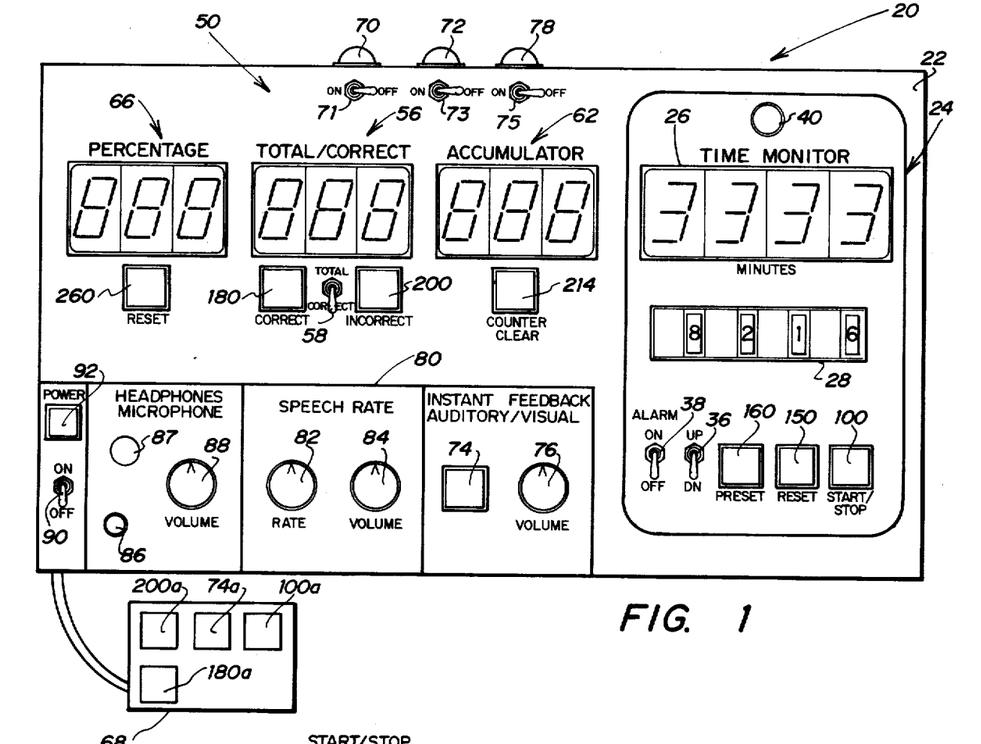
FIG. 1 is a front elevation view of a preferred embodiment of the invention, showing the various displays, signal buttons, and controls housed in one unit.

Referring specifically to FIG. 1, a speech therapy unit 20 is shown with a face plate 22 which is preferably located such that it is visible by the operator but not by the person being studied—at least during the early or "testing" phase of a program of speech therapy. During a later "speech modification" phase, the unit 20 may well be turned around so that the student can see the face plate and serve as the operator. For convenience hereinafter, the term "student" will usually be employed to refer to the person having a speech handicap, and the term "clinician" will usually refer to that person who is controlling the testing and/or attempting to improve a student's speech.

Referring initially to the first of three major sub-units of the device 20, an electric clock 24 is provided at a suitable location on the face 22. The purpose of this clock 24 is obviously to monitor the passage of time, and the unit is descriptively labeled accordingly. The clock 24 comprises a display means including a face or readout means 26 for indicating minutes and portions thereof. Preferably, the readout means 26 includes a digital display face which is adapted to indicate minutes as well as tenths and hundredths of minutes. Two digital display units such as SP 752 displays can be appropriately used in the clock, since they provide a readily visible and silent means of displaying time.

A time selector means 28 is also provided as part of the clock 24, and it preferably comprises a digital selector means in which numerals are displayed on the periphery of a set of wheels, and the wheels are turned by means of protrusions which are easily engaged by a person's finger. A switch 160 is provided in a circuit (to be described) which triggers the transfer of a selected time from the selector means 28 to the readout 26. The circuit is such that it will always cause the readout 26 to register the time which is set in the selector means 28 upon manual activation of the switch 160, regardless of whether the readout 26 was earlier manifesting a greater or smaller time than the time shown on the face of the selector means 28. A reset switch 150 is also provided to drive the readout means 26 to zero. A start/stop switch 100 is provided to make the connection between a source of power and a time keeping circuit for energizing said circuit. The switch 100, then, serves to both initiate and halt the change of time which is manifested by the display means 26.

A switch 108 is electrically connected to the time keeping circuit for establishing whether the clock is to count time "up" (as from zero) or to count time "down" from a preselected time (toward zero). In the "countdown" mode, the time which is manifested by the readout means 26 will eventually reach zero when the clock has run long enough. In order that the clinician need not continually turn to face the display 26, it is appropriate that an alarm of some kind be provided to announce that time has expired. However, there are certain students who might be distracted by an audible alarm. Accordingly, a switch 38 is preferably provided so that the operator may select either an audible or strickly a visual alarm. Visual notification of the expiration of time is preferably given by a blinking light 40 located at the top of the time monitor unit. In order that the audible alarm would not unduly interfere with a testing program which is under way, it is preferred that any sound (such as the noise made by a buzzer) be relatively short; but to make sure that the out-of-time notice rendered by said buzzer is not forgotten, it is preferred that a visual display element (such as the blinking light 40) be energized at about the same time that the buzzer is energized. In such an embodiment, the light 40 should blink continually until it is manually halted by actuation of the "preset" switch 160—which returns the unit to a ready condition for renewed count-down operation.

As a further means of rendering the time-counting operation "fail-safe", another alarm feature is advantageously built into the unit . . . in order to prevent the operator from unknowingly pressing the start button 100 for "countdown" operation without first making sure that the display means 26 is not already at zero. That is, if the operator has failed to program a desired time period into the clock by pressing the "Preset" button 160, then the clock would have nothing to count down to; pressing the Start button 100 would be useless. If the operator was unaware that he had failed to set the time monitor 24 correctly, he might spend a substantial period of time before realizing that the display 26 was not changing. To avoid this potential oversight by an operator, an alarm is given if an attempt is made to start the clock in a countdown mode when the display 26 is already at zero. Of course, the actual alarm hardware that is used to provide this result can be essentially the same alarm hardware which is utilized to alert the operator to the fact that a given period of time—which was once imparted to the display means 26—has expired.

Referring next to the second major sub-unit of the device 20, a calculator-type instrument is incorporated in the device to provide an instantaneous readout concerning the performance of a student. Of course, in dealing with students having a speech handicap, there is really no precise way that a student's performance can be mechanically graded—at least with today's technology. Hence, as a student attempts to repeat a series of words or read a sentence, etc., it will still be necessary for a clinician or other person to make a value judgment as to the correctness of the student's performance. Too, there are many ways in which a student may be asked to demonstrate his capability of making certain sounds or vocalizing certain words. For simplicity herein, however, it will probably be most convenient to speak merely in terms of "test questions" which are answered either correctly or incorrectly (even at the risk of taking some liberties with the term "question"). That is, if the student is asked to say the word "red" and he pronounces it like "wed," then the clinician would be expected to record that the student has given an incorrect response—which, of course, is like answering a question with the wrong answer.

In times past, it has been possible for a clinician to sit in front of a student with pencil and paper and record the number of "correct" and "incorrect" responses. And, after a certain period of time, the clinician could count the various answers and even determine what the percentage of correct answers has been—with a slide rule or calculator. However, in speech therapy, it is important not only to listen to a student's performance but also to observe what the student is doing with his lips, his tongue, etc. Accordingly, any manual activity which is required on the part of the clinician that prevents her from devoting full attention to the student has been a hinderance to accurate analysis of the student's handicap. Too, any time which is being consumed by the clinician in making calculations, keeping records, writing down the quantity of responses, etc. is administrative time that truly is not being spent in helping the student.

To overcome these difficulties of the past, the calculator unit 50 includes a first means including a circuit (to be described) and a button or switch 218 for generating an electrical signal in response to an operator's judgment that the student has answered a test question correctly. A first memory within the unit receives and stores the quantity of "correct" signals generated by this first means. A second means including a circuit (to be described) and a button or switch 200 is provided for generating an electrical signal in response to an operator's judgment that the student has answered a test question incorrectly. A second memory is provided in the unit 50 for recording the quantity of all signals which are generated by the operator, including both "correct" and "incorrect signals. A third memory is provided for recording and accumulating all such signals generated by the operator for both "correct" and "incorrect" signals, and it retains such accumulation when the second memory is blanked. A readout 56 is provided to display for the benefit of the operator the quantity of signals that have been recorded in the first or second memories. To economize on the number of physical readout components, it is possible to employ the same readout to render a status report from these two different memories; and, when this is done, a toggle switch 58 is provided to switch the readout 56 from connection with the first memory to connection with the second memory. The operator, then, would be able to exercise her own judgment as to which of these two quantities she would rather have displayed at any given time. A reset button 260 is provided for erasing the first and second memories in order to return the unit to a cleared condition for recording performance in a subsequent test. In order to prevent the loss of all stored information about a student's work during a test session, however, it is preferably that still another memory be provided which is adapted to provide a cumulative total of all questions asked. The display 62 is provided to make this third memory's contents available to the operator. It would usually be cleared only at the conclusion of a therapy session by actuating the counter clear button 64.

Of course, the electric displays 56, 62 provide a much neater manner of recording answers than the old fashioned pencil and paper; but actually they are probably no more accurate than a pencil and paper, and there might still be a chance of an arithmetical error if the clinician had to study the displays and then transfer the entries from the displays 56, 62 to a remote calculator. To avoid the possibility of human error (such as might happen if the clinician transposed a number, etc.), a dividing circuit is provided to repetitively and automatically divide the number of "correct" signals recorded in the first memory by the total number of signals recorded in the second memory. This division is accomplished after each entry of a signal into the memories, and a display 66 is provided for indicating in visual form the quotient which is obtained from that division step. Of course, that quotient will be recognized as being numerically equal to the percentage of correct answers, i.e., moving the decimal point two places to the right converts the quotient to a percentage. Because this percentage is visible to the operator immediately after each answer has been entered into the instrument, the operator need not turn his or her attention far away from the student in order to have an accurate knowledge of the student's performance. Because of this particular arrangement of on-going information flow to the clinician, she is now able to monitor and continually evaluate the relative success or failure of any given therapy technician in terms of student progress.

The signal buttons 100, 218, 200 are clearly shown as being present on the face of the instrument; but there may well be occasions when an operator's repetitive arm movement toward the unit 20 might become a distraction to a student. Hence it is preferred that a remote control box 68 be provided with additional buttons or switches mounted thereon—which buttons would be connected in parallel with the buttons 100, 218, 200 for starting and stopping the clock, and recording "correct" and "incorrect" answers. The remote control hand switch also allows the student, once he has been taught to accurately discriminate between correct and incorrrect production of target behavior, to record his own correct and incorrect responses without touching the instrument. In this way, children as young as six or seven years of age may actually conduct much of their own therapy practice sessions with only minimal supervision, and without risk of damaging the instrument. It is also possible that the clinicial may prefer that the student have some sort of immediate indication of how each of his responses were graded. To this end, a pair of indicator lights 70, 72 are provided on the top of the unit 20 where they may be seen by both the operator who is scoring a test and the student who is being tested or trained. Toggle switches 71, 73 are also provided so that the lights can be switched out of the circuit when their use is not wanted. A color coordination scheme for the buttons is preferably followed throughout the unit 20, so that a correct answer is recorded by the operator by pressing either the green button 218 on the face 22 or the green button 218A on the remote control device; naturally a green light 70 announces to the student that his response was deemed to be satisfactory. The "incorrect" button 200 on the unit and the button 200A on the remote control box are preferably red; and the lens 72 on top of the unit 29 is also red—for indicating that the student's response was not satisfactory.

While the operation of the switches 100, 218, 200 is essentially silent, it may be desirable from time to time for a clinician to render some sort of an auditory feedback signal to the student without interjecting any particular emotion into the signal. This is made possible with an auxiliary buzzer (which is preferably somewhat offensive) and a button 74 which can be pressed by the operator to generate the offensive buzzing noise. In order to accommodate students whose need for correction or whose sensitivity may be somewhat at variance with other students, a volume control 76 for this offensive buzzer is provided. By use of a yellow button 74 and a yellow light 78, the clinician can communicate with the student in a somewhat formal way, and can—for example—indicate disapproval of certain behavior, can remind the student to concentrate on the subject matter, can signal the passage of an inordinate amount of time in which to respond, etc. Also, under certain circumstances the student may progress in therapy to the point where he can utilize the unit 20 all by himself, and may grade himself on his pronunciation of certain words, etc. In such a situation, the student may be facing the instrument and pressing either the "correct" button 218 or the "incorrect" button 200; and the clinician can be somewhat removed from the location of the instrument, having only the remote control unit 68 in her possession. If the student then grades himself in a manner that the clinician does not agree with, the clinician can indicate her disagreement by actuating the switch 74A on the remote control box 68, thereby causing the offensive buzzer to be activated.

The third substantial sub-unit of the instrument 20 includes a speech rate generator 80, which includes a pulse rate control 82 and a volume control 84. Of course, this portion of the unit is connected to either a loudspeaker or a headset adapted to be worn by the student, whereby the pulse tones generated by the unit may serve to pace the student's speech. A volume control 88 is provided to adjust the volume of the pulse tones. It is probably easiest for the generator 80 to be simply energized and operating at all times when the unit 20 is powered, and the volume control 84 is adapted to turn the level of pulse tones down so low that they cannot be heard, i.e., essentially zero volume.

A microphone jack 86 and a headphone jack 87 are provided in the device 20 to allow the student to monitor his own amplified speech, as well as to privately hear the pulse tones generated by the unit 80. Too, the headset makes it possible for a clinician to privately inform the student of an error (through the use of the IAF button 74) without anyone else in the room being distracted by her action.

Line power to the instrument 20 is controlled by a toggle switch 90, with an indicator lamp 92 providing a visual indication that power is applied to the instrument.

Figure 2:
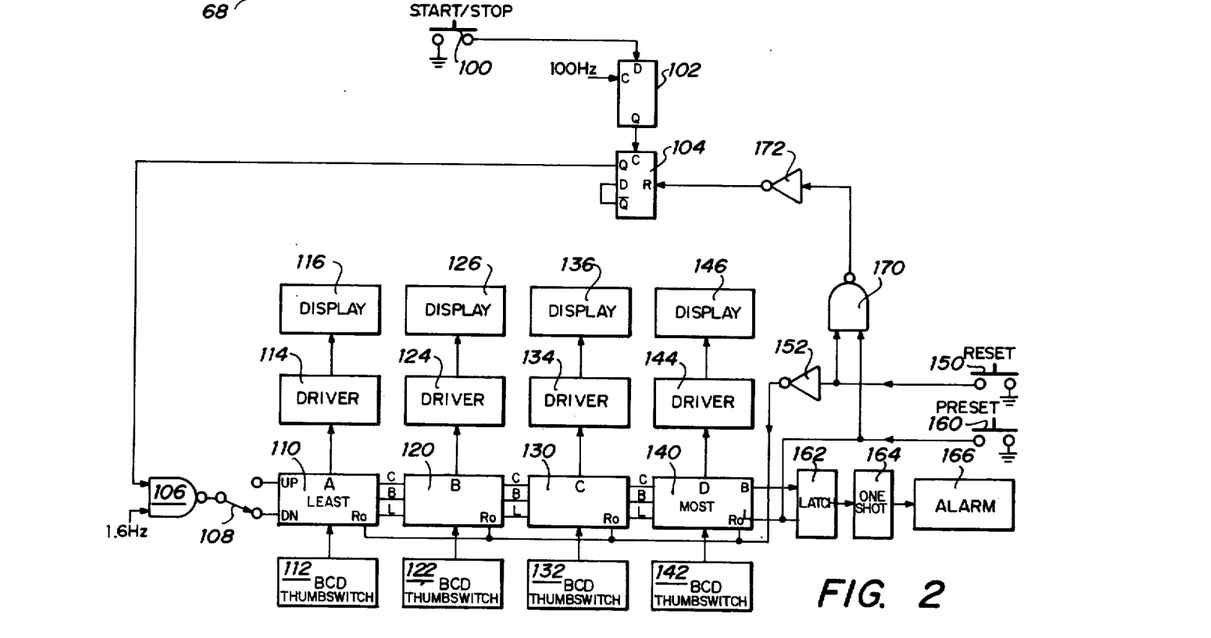
FIG. 2 is the block diagram of a programmable up/down clock, capable of displaying the time in minutes and hundredths of minutes.

Referring to FIG. 2, there is shown a logic diagram of a presettable up/down timing apparatus (clock) that displays time in hundredths of minutes. The clock consists basically of a gate controlling a 100 pulse per minute signal that activates four series connected decade counters which simultaneously control displays that give an indication of the time represented by these four counters.

A start/stop flip-flop 102 has one input terminal connected to a timer start/stop switch 100 and a second input terminal receiving a 100 Hz signal from a source (not shown). Starting the clock by momentarily closing the start/stop switch 100 applies a logic low at this input of flip-flop 102, thereby sending a signal from the output terminal Q of the flip-flop that is at a logic high. Similarly, stopping the clock by again momentarily closing start/stop switch 100 changes the input terminal of flip-flop 102 to a logic low, thereby reversing the signal from the output terminal Q of the flip-flop to a logic high.

The signal from the output terminal Q of flip-flop 102 is applied to an input terminal C of a timer reset flip-flop 104. When this signal to input terminal C changes from logic low to logic high, then an output terminal $\overline{Q}$ of flip-flop 104 is logic low, thereby producing the complement of this signal at an output terminal Q that is put in a logic high state.

The signal from the terminal Q of the reset flip-flop 104 is sent to an input terminal of a timer pulse NAND gate 106, which has a second input terminal receiving a 1.66 Hz signal from a source (not shown). Pulse NAND gate 106 produces a 100 pulse per minute signal at its output terminal only when the signal from the flip-flop 104 is in a logic high state. The signal thus generated by pulse NAND gate 106 is applied to a timer up/down switch 108 that enables a series of four decade counters 110, 120, 130 and 140 to count either up or down. When the operator selects the count up mode, the up/down switch 108 is set to send the pulse train from NAND gate 106 to the "up" input terminal of the "hundredths" decade counter 110. Likewise, when the operator selects the count down mode, up/down switch 108 is set to send the pulse train from NAND gate 106 to the "down" input terminal of the "hundredths" decade counter 110.

In the countup mode, the "hundredths" decade counter 110 adds one for each pulse received from the NAND gate 106. When the "hundredths" decade counter 110 has counted nine times in this manner, the next pulse resets this decade counter to zero and carries one pulse forward to the "tenths" decade counter 120, causing it to add one. The minutes decade counter 130 and the "tens" decade counter 140 are similarly connected in series when counting up so that the higher decade counter is pulsed once for every tenth pulse received by the next lower decade counter Prior to operation of the countdown mode, the decade counters 110, 120, 130 and 140 are loaded with a starting time in the form of a binary coded decimal digit that is preset from a corresponding ten position BCD complement thumb switch 112, 122, 132 and 142. An operator actuated preset switch 160 enables loading the decade counters 110, 120, 130 and 140 with the predetermind value.

When in the countdown mode, the pulse train from NAND gate 106 is received at the "down" input of the "hundredths" decade counter 110. Each pulse to the counter 110 borrows (or subtracts) once from the previous value in this counter. When decade counter 110 steps to zero, the next incoming pulse is unable to borrow from this counter and is sent to the "down" input terminal of the "tenths" decade counter 120, borrowing one from it and reloads the counter 110 to enable the subtraction to continue from the decade counter 110. Thus, the next higher decade counter is pulsed once every ten times the lower decade counter is pulsed. The minutes decade counter 130 and the "tens" decade counter 140 are similarly connected when the clock is in the countdown mode.

In either a countup mode or a countdown mode, a binary coded decimal digit in the "hundredths" decade counter 110 is displayed as a decimal digit in digital display 116 by a "hundredths" digital driver 114 which receives the signal from the "hundredths" decade counter. Similarly, a "tenths" digital display 126, a minutes digital display 136, and a "tens" digital display 146 simultaneously display the decimal value of their corresponding decade counters 120, 130 and 140. Each of the displays 126, 136, and 146 is connected to the corresponding decade counter through respective digital drivers, i.e., a "tenths" digital driver 124, a minutes digital driver 134, and a "tens" digital driver 144.

An operator actuated switch 150 enables resetting the decade counters 110, 120, 130 and 140 to zero and shutting off the signal from the NAND gate 106. First, momentarily closing reset switch 150 enables a signal to be sent through a zero reset inverter 152 that changes its output from a logic low to a logic high. This signal from the reset inverter 152 is applied to decade counters 110, 120, 130 and 140, thereby resetting these counters to zero. Secondly, momentarily closing the reset switch 150 applies a logic low signal to an input of a preset/reset NAND gate 170, thereby changing the logic low output signal to a logic high. This output signal is applied to the input of a preset/reset inverter 172 which produces an output signal at a logic low state. This output signal is in turn applied to an input terminal R of the timer reset flip-flop 104 which operates to toggle or reset the logic state at the output terminal Q of this flip-flop. Reversing the logic state at the output terminal Q from high to low changes the logic state of the signal at the input terminal of pulse NAND gate 106 from logic high to logic low, thereby terminating the pulse output from the NAND gate.

Momentarily closing preset switch 160 enables the presettable up/down clock to perform three functions. The operation of loading decade counters 110, 120, 130 and 140 with a BCD value preset in thumb switches 112, 122, 132 and 142 has already been mentioned. Secondly, closing preset switch 160 applies a signal at a second input terminal of the preset/reset NAND gate 170 that is at a logic low. This provides a logic high signal at the output terminal of NAND gate 170, and the effect of this signal is the same as described above in the operation of reset switch 150.

Finally, closing preset switch 160 enables the operator to set a zero alarm latch 162 that holds a logic output state indicating that some value has been loaded into the decade counters. the borrow output terminal of the "tens" decade counter 140 applies a pulse signal to a second input terminal of the alarm latch 162, when all decade counters have reached zero. This signal resets the logic state at the output terminal of the alarm latch 162. This output is applied to an input terminal T of a zero alarm one shot 164. The one shot 164 produces an output signal at its terminal $\overline{Q}$ that is applied to the input terminal of an alarm 166 signaling that either a countdown operation has been attempted when all decade counters are zero, or that the countdown operation has been completed. Alarm 166 may use either audio or visual means of signaling the operator.

The following example will serve to illustrate the operation of the up/down clock of FIG. 2. If the operator desires to time a ten minute exercise, then ten minutes are preset on BCD thumb switches by placing a "1" in BCD thumb switch 142 and "0's" in BCD thumb switches 112, 122 and 132. These numbers are loaded into decade counters 110, 120, 130 and 140 by momentarily closing preset switch 160, and these numbers are simultaneously displayed in the displays 116, 126, 136 and 146. The up/down switch 108 is moved to the down position so that the clock is now ready for operation. Momentarily closing start/stop switch 100 starts the clock by generating a signal of 100 pulses per minute at the output of pulse NAND gate 106. The clock begins to count down and simultaneously displays the remaining time in the counters, continues counting until either the start/stop switch 100 is again closed, or the decade counters step to zero to indicate the present time has expired. When time expires, all decade counters will show zero and a borrow pulse will set zero alarm latch 162, thereby signaling the operator through alarm 166 that the ten minute period has elapsed.

The operation of the clock in counting up is similar to the operation described above. The operator sets up/down switch 108 in the up position and has the option of counting up from time zero or some preset time loaded through BCD thumb switches 112, 122, 132 and 142. The operator actuates the clock in the same manner by momentarily closing start/stop switch 100. The clock will continue to run until the operator closes start/stop switch 100.

Figure 3:
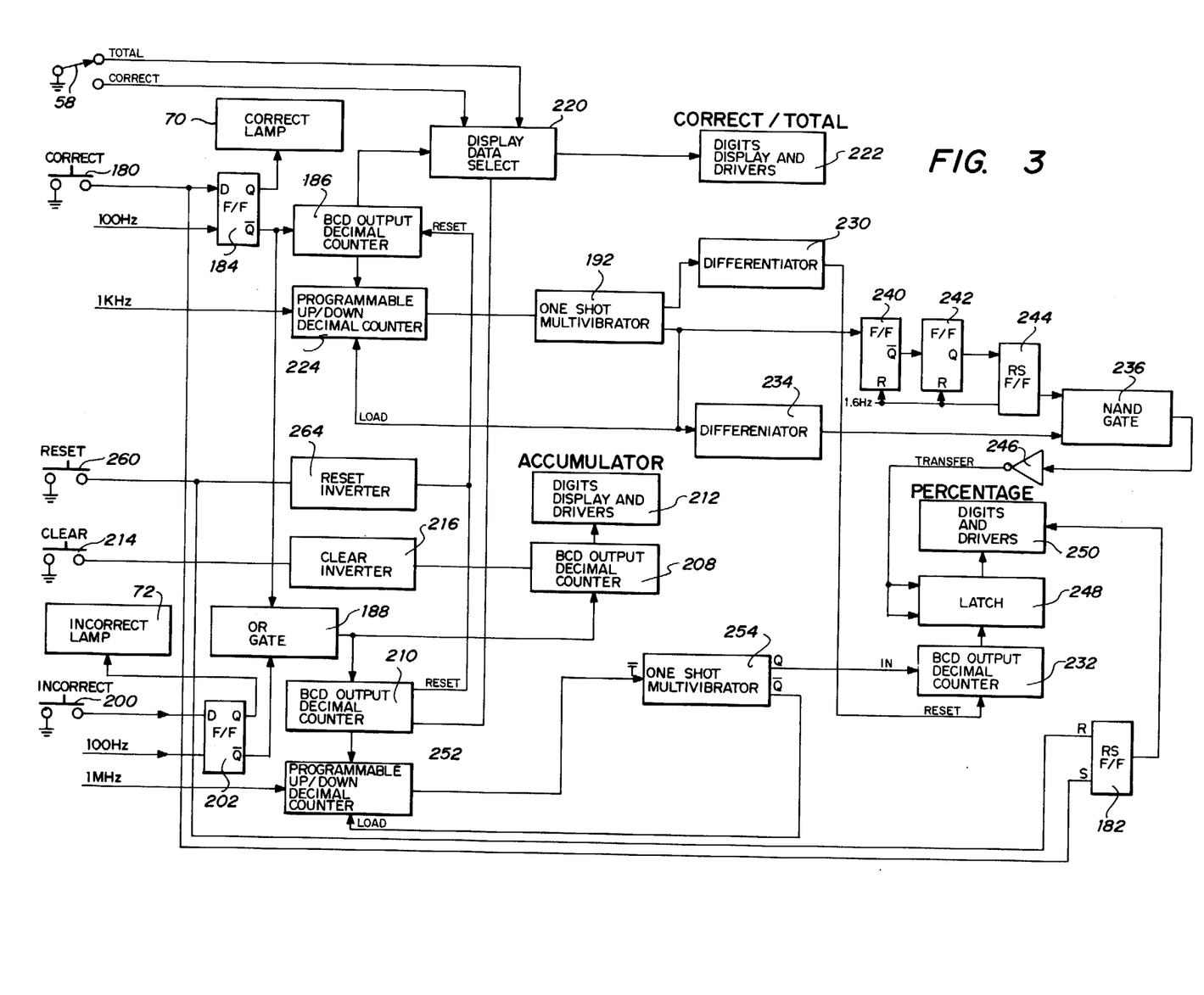
FIG. 3 is a block diagram of an automatic percentage computer with counters and displays for the correct, total and accumulated number of responses.

Referring to FIG. 3, there is shown a block diagram of a percentage computer for the computation of the percentage of the correct responses given by a speech student during the operation of the testing apparatus. The percentage computer includes means to compute and to display the percentage of correct responses, means to count both correct and total response and means to display either the number of correct or total responses, and means to count and display an accumulation or grand total of responses over a certain period of time.

An operator actuated correct response (CR) switch 180 is momentarily closed to input a correct response signal to the percentage computer. The CR switch 180 causes the input signal to set a computer display blanking (CDB) latch 182 and also applies the correct response signal to an input terminal D of a correct response (CR) flip-flop 184, thereby setting the logic levels at the output terminals Q and $\overline{Q}$. The output signal at the terminal $\overline{Q}$ of the CR flip-flop 184 is applied to both a correct response divisor (CRD) counter 186 and a total response OR gate 188. The signal at the output terminal Q of CR flip-flop 184 is applied to a correct response lamp display 190. thereby visually indicating a correct response from the speech student.

An operator actuated incorrect response (IR) switch 200 is momentarily closed to record an incorrect response. The IR switch 200 enables a pulse signal to be applied to the input terminal D of an incorrect response (IR) flip-flop 202, thereby setting the logic levels of the terminals Q and $\overline{Q}$. The output signal at the terminal $\overline{Q}$ of the IR flip-flop 202 is applied to the second input terminal of the total response OR gate 188, and the signal from the output terminal Q is applied to an incorrect response lamp display 206, thereby giving a visual indication of an incorrect response by a speech student.

When the total response OR gate 188 receives an input signal from either the CR flip-flip 184 or the IR flip-flop 202, an output signal is applied to a total response counter 208 and a total response divisor (TRD) counter 210. The total response counter 208 continuously applies an output signal to a total display and driver 212, thereby presenting a visual indication of the information in the total response counter 208.

A signal from an operator actuated clear counter switch 214 applies a signal through a clear counter inverter 216 to clear the total response counter 208.

The CRD counter 186 and the TRD counter 210 each apply an output signal to a total/correct (T/C) display selector 220. The T/C displays either the information in the CRD counter 186 or the TRD counter 210 depending on the setting of a total/correct switch 218. When actuated from either the CRD counter 186 or the TRD counter 210, the T/C display selector 220 continuously applies an output signal to the input terminal of a total/correct (T/C) display and driver 222, thereby visually displaying either the number of correct responses or an accumulation of the total responses.

A second output signal of the CRD counter 186 is applied to a programmable correct response (PCR) counter 224, which receives a 1 KHz signal applied to an input terminal. This 1 KHz signal programs the PCR counter to count down. The PCR counter 224 consists of three counters that are interconnected in a borrowed pulse configuration to borrow a needed pulse from a lower digit counter to the next highest digit counter. The PCR counter 226 applies a borrow pulse from an output terminal for the most significant digit to the input of a correct one-shot multivibrator 192. The frequency of the borrowed pulse from the PCR counter 224 to the one-shot multivibrator is obtained by dividing the 1 KHz signal by a number preset in the PCR counter.

Output signals from the correct one-shot multivibrator 192 have the same frequency as the borrowed pulse from the PCR counter 224. A signal from the output terminal Q of the one-shot multivibrator 192 is normally logic low, and a complementary output signal at terminal $\overline{Q}$ is normally high with the signal from terminal Q applied to a reset percentage counter (RPC) differentiator 230. The RPC differentiator 230 in turn provides a signal to percentage counter 232 when the signal from terminal Q is logic low. The terminal $\overline{Q}$ of the one-shot multivibraor 192 connects to the PCR counter 224, a differentiator 234 and a flip-flop 240.

When an input signal is received by the correct one-shot multivibrator 192, the output terminal $\overline{Q}$ momentarily goes low while the output at terminal Q momentarily goes high. When the output at terminal $\overline{Q}$ is logic low, it applies a signal to load the total from the CRD counter 186 into the PCR counter 224, so that the calculation may continue. The logic low output signal of $\overline{Q}$ is also applied to the transfer pulse (TP) differentiator 234 and the first delay flip-flop 240. The TP differentiator 234 provides an output pulse of short duration having a period equal to the reciprocal of its input frequency. This logic output signal from the TP differentiator 234 is applied to an input terminal of a transfer pulse (TP) NAND gate 236.

The input signal to the first delay flip-flop 240 has a frequency determined by dividing the 1 KHz signal by the number preset in the PCR counter 224. Also applied to the first delay flip-flop 240 is a 1.6 Hz signal to terminal R to reset it every hundredth of a minute. The output signal from the first delay flip-flop 240 at the terminal $\overline{Q}$ thus varies at one-half the frequency of the input from the one-shot multivibrator 192 and is applied to an input terminal of a second delay flip-flop 242, which generates an output signal at a terminal Q that varies at one-half the frequency of its input signal. Thus, the combined effect of the first delay flip-flop 240 and the second delay flip-flop 242 is to divide the frequency from the one-shot multivibrator 192 by four. The second delay flip-flop 242 is also reset every hundredth of a minute by the 1.6 Hz signal applied to a reset terminal R.

The second delay flip-flop 242 generates a signal that is applied to a delay latch 244 that is set every hundredth of a minute by the 1.6 Hz signal. A signal at the output terminal of the delay latch 244 enables the TP NAND gate 236 to produce a logic low output when its two input terminals are logic high.

A transfer pulse inverter 246 converts the output of the TP NAND gate 236 from logic low to logic high and then applies it to a transfer pulse (TP) latch 248. The TP latch 248 is then enabled to transfer information stored in the percentage counter 232 for a period of time measured by the pulse width at the output of the TP differentiator 234. The TP latch 248 transfers this information to a percentage display and driver 250 to give a visual display of the percentage of correct responses to total responses given by a speech student.

Referring to the TRD counter 210, this counter applies a signal to a programmable total response (PTR) counter 252 that consists of three separate counters with a 1 MHz signal applied to an input terminal of the least significant digit counter. The 1 MHz signal programs the PTR counter to count down. The counters for each of the digits are interconnected by a bar pulse that is applied from a lower digit counter to the next higher digit counter. The PTR counter 252 generates an output signal of a frequency determined by dividing the 1 MHz input signal by the total count in the PTR counter. This output signal is applied to the total one-shot multivibrator 254.

Output signals at terminals Q and $\overline{Q}$ of the one-shot multivibrator 254 have the same frequency as the input signal. The output at terminal Q is a logic high pulse applied to the input terminal of the percentage counter 232. The output terminal $\overline{Q}$ is the complement of the terminal Q output signal, or a logic low pulse, and is applied to the PTR counter 252, thereby enabling the transfer of data in the TDR counter 210 into the PTR counter for continuous calculation.

As has been described above, the output signal from the percentage counter 232 is a signal at the same frequency as its input signal. This frequency is counted for a period of time determined by the length of time the TP NAND gate 236 enables the TP latch 248. Enabling the TP latch 248 to count the number of pulses from the percentage counter 232 yields the percentage of a student's correct responses in the display and drivers 250.

An operator actuated reset switch 260 produces a signal that is applied to the CDB latch 182, thereby resetting this latch and triggering an output signal that is applied to the percentage display and driver 250, resetting it to zero. Momentarily closing the reset switch 260 also provides a signal to a reset inverter 264 having an output applied to both the CRD counter 186 and the TRD counter 210, resetting them both to zero.

An example will serve to illustrate how the percentage computer of FIG. 3 operates. The operator momentarily presses the reset button 260 and also a clear button 214 to reset all counters and registers to zero. When the CR switch 180 is actuated in response to a correct student answer, a one count is simultaneously loaded into both the CRD counter 186 and the TRD counter 210. If the student next answers incorrectly, the operator presses the IR switch 200, thereby loading a one count into only the TRD counter 210. The one count in the CRD counter 186 (one correct answer) is used as the divisor of the 1 KHz input signal in the PCR counter 224. Dividing the 1 KGz signal by one yields an output signal of 1 KHz.

Assuming one correct and one incorrect answer, the number two is present in the TRD counter 210, and this number becomes the divisor of the 1 MHz signal in the PTR counter 252. Dividing the 1 MHz signal by two yields an output signal of 500 KHz frequency.

The operator may set the total/correct switch 218 in either the correct or total position, thereby enabling the total/correct display selector 220 to contain the total number (002) or the correct number (001).

For the test exercise as described to this point, the total display and driver 212 also displays (002) as the accumulation of all responses. If the operator terminates the test exercise at this point, then reset switch 260 is pressed to reset to zero only the CRD counter 186 and the TRD counter 210. When the operator then inputs another correct or incorrect response from a student, the total display and driver 212 contains "003" as the accumulation of all responses.

Next considering the percentage computer, it operates by counting the frequency of the signal from the PTR counter 252 for a period of time determined by taking the reciprocal of the frequency of a borrow pulse from the PCR counter 224. The TP differentiator 234 controls the period of time by providing an output between the negative edges of its input signal received through the one-shot multivibrator 192 from the PCR counter 224. The output of the differentiator 234 is applied through the TP NAND gate 236 to enable the latch 248 to pass information from the percentage counter 232 connected through the one-shot multivibrator 254 to the PTR counter 252.

The first delay flip-flop 240, the second delay flip-flop 242, and the delay latch 244 all operate to give upper and lower limits to the frequency at which the NAND gate 236 is in a logic state to pass timing pulses from the TP differentiator 234 to the transfer pulse latch 248. The 1.6 Hz signal applied to the two flip-flops, 240 and 242, and the delay latch 244 causes the TP NAND gate 235 to be enabled at least every hundredth of a minute. Functionally, the first and second delay flip-flops 240 and 242 divide the frequency from output terminal $\overline{Q}$ of the correct one-short multivibrator 192 by four, otherwise the NAND gate 236 will generate transfer pulses every millisecond, which is considered too fast.

The 500 KHz signal from the one-shot multivibrator 254 is received by the percentage counter 232, and is transferred from there to the percentage display and driver 262 for one millisecond. When the transfer pulse latch 248 closes after the millisecond transfer period, the reset differentiator 230 resets the percentage counter 232 to zero, thereby causing the counter to begin a new count from zero. Thus, for the example of one correct answer and one incorrect answer, the number displayed in the percentage display and driver 262 is "50.0". The percentage computer has correctly indicated the percentage of correct responses given by the speech student, and it is set to continue this calculation for additional responses.

Figures 4, 5, 6:
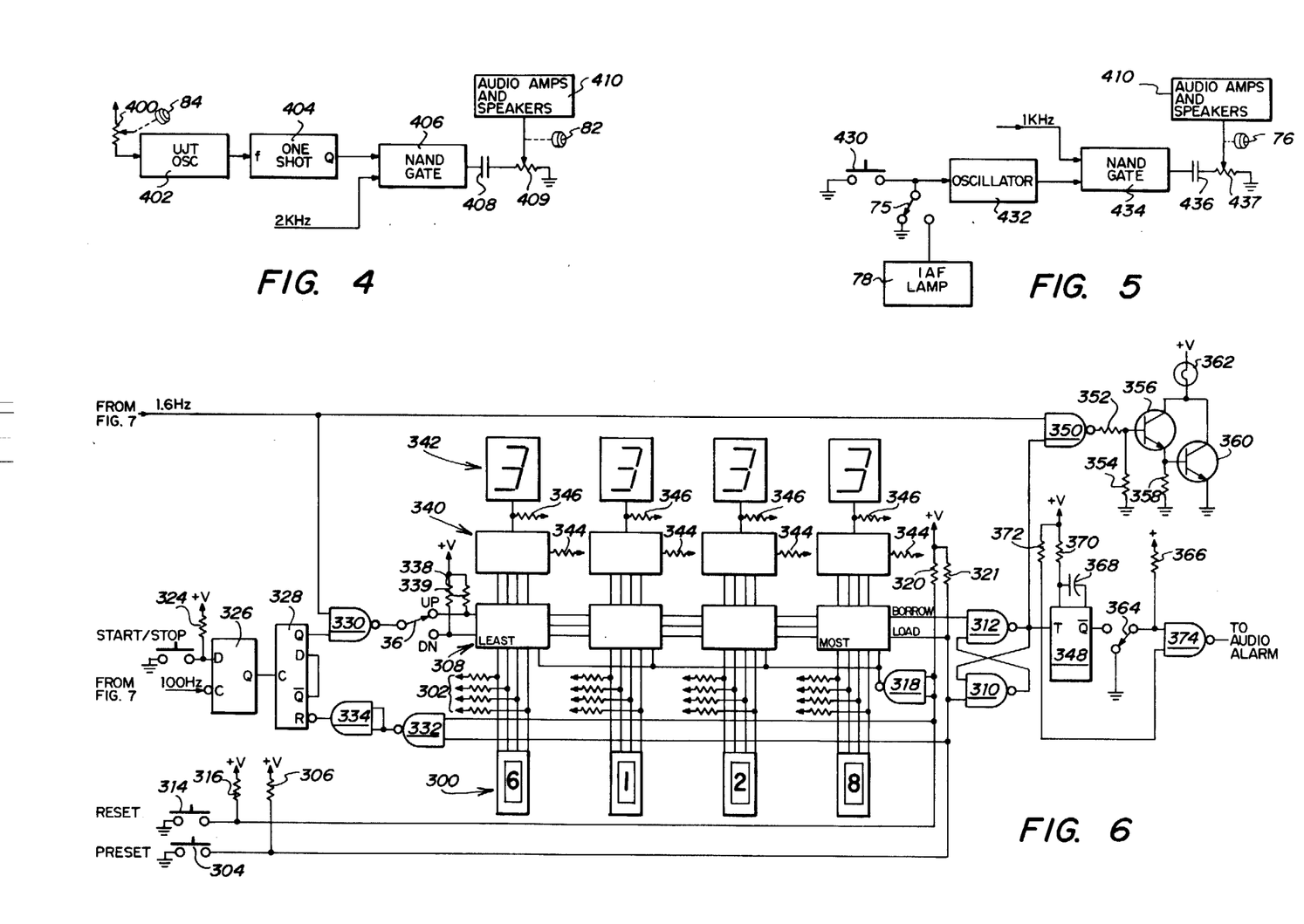
FIG. 4 is the block diagram of an adjustable aural speech rate unit of the speech therapy apparatus.
FIG. 5 is a block diagram of the immediate audio feedback unit of the speech therapy apparatus.
FIG. 6 is a schematic of the programmable up/down clock and the associated alarm unit of the speech therapy apparatus.

Referring to FIG. 4, there is illustrated in block diagram form the speech rate sub-unit of the speech therapy teaching instrument 20 including the volume control 82 and the rate control 84.

A variable resistor 400 coupled to the rate control 84 adjusts the signal rate at an input terminal of a UJT oscillator 402 having an output that is applied to an input terminal T of a one-shot multivibrator 404.

The multivibrator 404 is triggered to generate a logic high output signal at its output terminal Q that is applied to an input terminal of a speed rate NAND gate 406. A 2 KHz signal is applied to the second input terminal of the NAND gate 406 from a source (not shown). The generated output signal from the multivibrator 404 causes the NAND gate 406 to produce a logic low output signal and apply it to a speech rate volume control circuit comprising a capacitor 408 in series with a variable resistor 409. The variable resistor 409 is mechanically coupled to the volume control 82 and varies the amplitude of an input signal applied to an audio amplifier 410 normally connected to a speaker (not shown). The output signal from the amplifier 410 may also be applied to the headset (not shown). An individual speech therapy student may hear the aural speech rate device by plugging his headset into the output of the amplifier 410.

If the headset device is not plugged into the headset jack, then the signal from audio amplifier 410 is applied to a standard speaker. The amplifier 410 boosts the input signal and applies this signal as the input of the speaker.

The speaker (not shown) is housed within the speech therapy teaching instrument 20, thereby enabling the student to hear the beep tones of the speech rate device without wearing the headset. The speaker is not limited to this one use, however, and it also receives the immediate audio feedback signal and the clock's zero alarm signal.

Referring to FIG. 5, there is illustrated in block diagram form the immediate audio feedback (IAF) system of the speech therapy teaching instrument 20. An operator actuated IAF buzzer switch 430 is momentarily depressed to cause a signal to be applied to an IAF oscillator 432 and to energize the IAF lamp 78. The oscillator 432 has a low frequency output signal applied to an input terminal of an IAF NAND gate 434, which also receives a 1 KHz signal applied to a second input terminal to produce a harsh tone to alert the student. A signal from the oscillator 432 enables the NAND gate 434 to have a logic low signal at its output terminal applied to a buzzer volume control circuit including a capacitor 436 in series with a variable resistor 437. The resistor 437 is mechanically coupled to the volume control 76. The volume control 76 adjusts the amplitude of the input signal applied to an amplifier 410 (described above). The harsh tone of the buzzer signal at the wiper arm of the resistor 437 is transmitted to the speaker unless the headset device is in use.

FIG. 6 is a schematic for both the programmable up/down clock and the alarm circuit associated therewith. When in a countdown mode, the operator presets some initial time in the clock by means of four BCD complement thumb switches 300. Each of the four leads from thumb switches 300 is individually connected to a positive voltage source through individual pull up resistors 302. A timer preset switch 304 is momentarily closed, and the preset time set in the thumb switches 300 is loaded into programmable up/down decade counters 308a, 308b, 308c and 308d. Connected to one terminal of the timer preset switch 304 is a pull up resistor 306. A signal from the preset switch 304 is also applied to set a zero alarm latch consisting of two interconnected NAND gates 310 and 312.

To reset to zero the programmable counters 308a, 308b, 308c and 308d, a counter reset switch 314 is momentarily closed to apply a signal to a NAND gate inverter 318. A pull up resistor 316 is connected to one terminal of the reset switch 314, while pull up resistors 320 and 321 are tied separately to the input terminals of NAND gate inverter 318 and NAND gate 310.

An operator actuated timer start/stop switch 322 has one terminal tied to ground and a second terminal tied to a pull up resistor 324. Momentarily closing start/stop switch 322 applies a signal to terminal D of a primary flip-flop 326, which has a 100 Hz signal applied to its input terminal C. The signal at output terminal Q of the primary flip-flop 326 is applied to a resettable flip-flop 328 having an output signal at its terminal Q applied to one input terminal of a timer NAND gate 330 that controls the running of clock counters. The other input terminal of the NAND gate 330 is a 1.6 Hz signal from a frequency source (not shown). The timer NAND gate 330 is controlled by momentarily closing the start/stop switch 332 or by a signal applied to terminal R of the resettable flip-flop 328.

Preset switch 304 is also connected to one input terminal of a reset NAND gate 332 having a second input tied to the reset switch 314. Thus, the clock counter may also be stopped by pressing the preset switch 304 and then the timer reset switch 314. This enables the reset NAND gate 332 and a signal is applied to a reset inverter 334 which toggles the output terminal Q of the resettable flip-flop 328 through its terminal R.

A clock toggle switch 336 allows the operator to selectively apply a 100 pulse per minute signal from the timer NAND gate 330 to either the up or down input of the up/down counters 308a, 308b, 308c and 308d. Pull up resistors 338 and 339 are individually connected to the up or down input terminals.

Up/down decade counter 308a first receives the pulse train from NAND gate 330 and it is the counter for the least significant digit. The counters 308a, 308b, 308c and 308d are arranged in ascending order from left to right, from the least to the most significant digit. The up/down counters 308a-d are interconnected for the following functions: (1) loading a preset time period, (2) borrowing a bit from the next significant digit counter, and (3) carrying a bit to the next higher decade counter.

Each of the up/down decade counters 308a-d is connected to an associated driver 340 in order to display the BCD value in the counter in decimal format inan associated electronic digital display 342. The display drivers 340 are individually connected to a pull up resistor 344, and having an output connected to a pull up resistor 346 to limit the brightness of the ditital displays 342.

The most significant decimal counter 308d generates a borrow pulse as an output when all the decade counters are zero. This borrow pulse is applied to the second input terminal of the alarm latch NAND gate 312, thereby resetting the latch to generate a signal to an alarm circuit.

A signal from the alarm latch is applied to both an audio alarm one-shot multivibrator 348 and one input terminal of a visual alarm NAND gate 350. The second input terminal of the visual alarm NAND gate 350 receives the 1.6 Hz signal from a frequency source (not shown). A 100 pulse per minute signal from the NAND gate 350 is applied through a limiting resistor 352 to the base of an NPN transistor 356 that is also connected to ground through a resistor 354. The emitter of NPN transistors 356 is tied to the base of NPN transistor 360, which is also connected to ground through a resistor 358. The collector electrodes of NPN transistors 356 and 360 are interconnected to an alarm zero lamp 362, flashing it at the rate of 100 times per minute, when energized.

Connected to the terminal Q of the alarm one-shot multivibrator 348 is an alarm on/off switch 364, having a second terminal connected to the pull up resistor 366.

This switch 364 allows the operator to manually control the audio portion of the alarm. In an automatic alarm mode, an audio alarm NAND gate 374 receives a signal from the output terminal $\overline{Q}$ of the audio alarm one-shot multivibrator 348 through the alarm on/off switch 364. The second input terminal of the audio alarm NAND gate 374 is connected to a current limiting resistor 372 which is connected to a voltage source (not shown).

Figure 7:
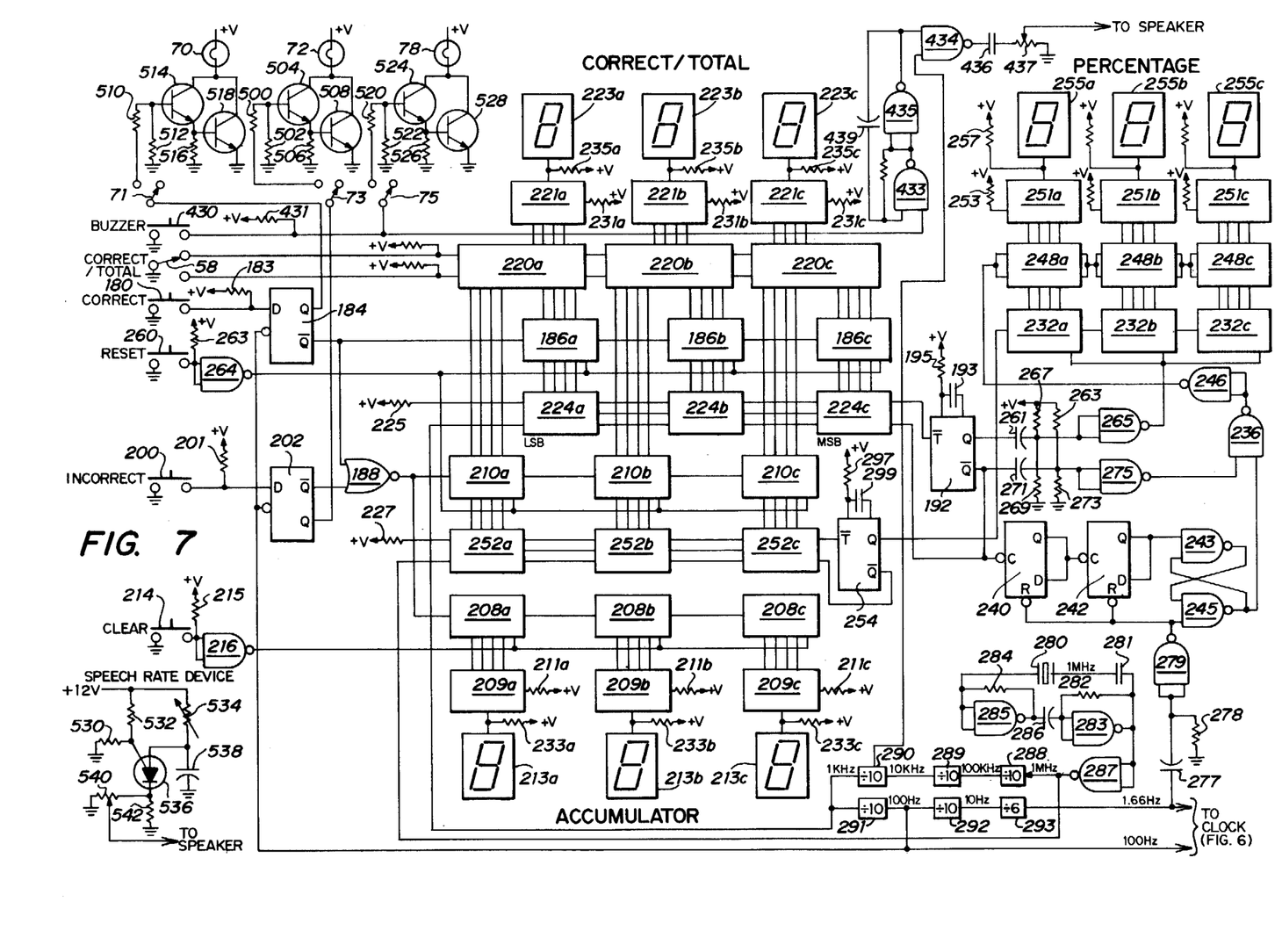
FIG. 7 is a schematic of the circuit components for a crystal oscillator, an automatic percentage computer, an adjustable aural speech rate device and an immediate audio feedback with audio and visual mans of altering students.

Referring to FIG. 7, there is shown a schematic of the automatic percentage computer, the immediate audio feedback unit, the aural speech rate device, and a time base generator for both the percentage computer and the programmable clock.

A crystal controlled oscillator 280 generates a 1 MHz sinusoidal signal that is applied to a NAND gate 285 with a clamping resistor 284 connected between the output terminal and input terminals. An output signal from the NAND gate 284 is applied through a capacitor 286 to the input terminals of a NAND gate 283, having a clamping resistor 282. The 1 MHz sinusoidal signal from oscillator 280 is applied to the two input terminals of NAND gate 285, while the other output terminal of oscillator 280 is coupled through a capacitor 281 to the output of NAND gate 283. Coupling the NAND gates 283 and 285 circuit across the output of oscillator 280 converts the sinusoidal waveform into a 1 MHz square wave at the output terminal of NAND gate 283.

An inverter 287 couples this 1 MHz square wave to six series connected frequency dividers, 288–293, producing signals with the desired frequency for use in the clock and the percentage computer. Frequency dividers 288–292 successively divide the 1 MHz signal by a divisor of 10 to yield a 10 Hz signal at the output of frequency divider 292. A 1.66 Hz signal is generated at the output of frequency divider 293 by dividing its 10 Hz input signal by a divisor of 6. The 1.66 Hz signal of the output of divider 293 and the 100 Hz signal at the output of divider 291 are both applied to the circuit of the programmable up/down clock of FIG. 6.

A clinician normally begins operation of the instrument 20 by clearing all counters and resistors. A reset switch 260 is momentarily depressed to connect a voltage source to the input terminals of a reset inverter 264 through a pull up resistor 263, thereby resetting to zero the "correct" decimal counters 186a, 186b and 186c and the "incorrect" decimal counters 210a, 210b and 210c. In addition, a counter clear switch 214 may be momentarily depressed to connect a voltage source applied to the input terminals of the clear inverter 216 through pull up resistor 215, thereby resetting the accumulator counters 208a, 208b and 208c.

During a timed exercise, the clinician indicates a student's acceptable answer by momentarily depressing the "correct" switch 180, thereby enabling a voltage source (not shown) to trigger the "correct" flip-flop 184 through a pull up resistor 183. A logic high signal at the output of the flip-flop 184 is transmitted to energize the "correct" lamp indicator 70. The signal from output terminal Q of flip-flop 184 is connected to the base of an NPN transistor 514 through limiting a resistor 510. Both base and emitter electrodes of transistor 514 are tied to ground through resistors 512 and 516, respectively. Directly coupled to the emitter electrode of transistor 514 is the base electrode of an NPN transistor 518, while the collector of transistor 514 is connected to one terminal of the lamp 70 and to the collector electrode of transistor 518. The emitter electrode of the transistor 518 is connected to ground. Connected to the second terminal of the "correct" indicator lamp 70 is the positive terminal of a voltage source (not shown).

A logic low signal transmitted from the output terminal $\overline{Q}$ of flip-flop 184 is applied to an input terminal of an OR gate 188 and an input of the "correct" decimal counters 186a, 186b and 186c. The BCD outputs of counters 186a, 186b and 186c are applied to the correct/total display selectors 220a, 220b and 220c, respectively.

The operator selectively positions the correct/total switch 258 to enable the display selectors 220a–220c to be energized through a voltage source connected to either pull up resistor 217 or pull up resistor 219, thereby enabling selectors 220a–220c in a mode of operation to produce one of two outputs to display drivers 221a, 221b, 221c. Display drivers 221a–221c are individually connected to a voltage source (not shown) through respective resistors 231a, 231b and 231c. Either of the two outputs of each of the display drivers 221a–221c is individually connect to digital displays 223a, 223b and 223c, which are individually driven by a voltage developed across resistors 235a, 235b and 235c, connecting the output of the drivers 221a–221c and to a voltage source (not shown).

The "correct" up/down programmable counters 224a, 224b and 224c are interconnected to operate only in the countdown mode of the instrument 20. The counter 224a registers the least significant bit and has a down input terminal connected to a 1 KHz signal from the output of frequency divider 290. A pull up resistor 225 connects a voltage source (not shown) to the up input terminal of counter 224a. Each of the programmable counters 224a–224c is interconnected such that the BCD output of counters 186a–186c becomes the divisor of the 1 KHz signal in the respective counters 224a, 224b and 224c.

A borrow pulse from the most significant bit counter 224c triggers the output at terminal $\overline{Q}$ of a one-shot multivibrator 192 at a frequency determined by dividing the 1 KHz signal by the number of correct answers stored in counters 186a–186c. The information in the signal from terminal $\overline{Q}$ of the multivibrator 192 is transmitted to counters 224a, 224b and 224c to load data stored therein into the counters 186a, 186b and 186c.

A voltage source (not shown) is applied to the multivibrator 192 through a resistor 195 with a capacitor 193 coupled across the terminals of multivibrator 192 and to the resistor 195.

A logic high signal from the output terminal Q of the multivibrator 192 operates through a time delay circuit to reset the percentge computer counters 232a–232c. The logic high signal from output terminal Q is transmitted through a capacitor 261 to the input terminals of a NAND gate 265, having both input terminals connected to a voltage source (not shown) at the interconnection of a voltage divider including resistors 267 and 269, the latter connected to ground. An output terminal of the NAND gate 265 is connected to the reset terminals of the computer counters 232a–232c.

A logic signal is triggered at the output terminal $\overline{Q}$ of the multivibrator 192 and connected through a time delay circuit, similar to the one described above, to an input terminal of a NAND gate 236. The logic low signal of the multivibrator 192 is applied through a capacitor 271 to the two input terminals of a NAND gate 275, having both input terminals also connected to a voltage source (not shown) at the interconnection of resistors 263 and 273, the latter connected to ground.

An output terminal of the NAND gate 275 is connected to one of the input terminals of the NAND gate 236.

The logic low signal from output terminal $\overline{Q}$ of the multivibrator 192 is also applied to the C input terminal of a first delay flip-flop 240. Terminals D and Q of flip-flop 240 are interconnected such that the output from terminal Q is onehalf the frequency of the input signal at terminal C. This delayed signal is fed to input terminal C of a second delay flip-flop 242, also having terminals D and Q interconnected to again divide the frequency by a factor of 2.

A signal from output terminal Q of the flip-flop 242 is applied to one terminal of a NAND gate 243 having an output terminal connected to an input terminal of a second NAND gate 245 as a NAND gate latch. NAND gate 245 has its output connected to the input of NAND gate 243 and a second input of of the NAND gate 236. The second input terminal of NAND gate 245 is connected to the output of a NAND gate 279, which receives a 1.66 Hz signal from the frequency divider 293 through a coupling capacitor 277. The input terminals of NAND gate 279 are also connected to ground through a resistor 278.

In addition to driving the input terminal of gate 245, the output of gate 279 is also applied to toggle flip-flops 240 and 242 through connections at their respective reset terminals R.

As mentioned, the signal generated at the output of NAND gate 245 is applied to the second input terminal of NAND gate 236 having an output signal that is inverted by applying it to the two input terminals of a NAND gate 246. An output of the NAND gate 246 is connected to the two input terminals of computer latch 248a, interconnected with computer latches 248b and 248c.

Latches 248a-248c receive the BCD output signal from computer counters 232a-232c, respectively. Thus, by an interconnection to the NAND gate 246, the latches 248a-248c operate for a calculated period of time to transfer the signal from counters 232a-232c to respective display drivers 251a-251c. Resistors 253a-253c individually connect the display drivers 251a-251c to a voltage source (not shown).

Visual displays 255a, 255b and 255c display the computer percentage in decimal format when energized by an output from their respective display drivers 253a-253c. The digital displays 255a-255c are individually driven by an input signal developed across pull up resistors 257a-157c connected to a voltage source (not shown).

Data transferred into the computer counters 232a-232c represents the number of "incorrect" answers, which comes from output terminal Q of a one-shot multivibrator 254. This multivibrator 254 is connected to a voltage source (not shown) through a resistor 297 with a capacitor 299 coupled across the terminals of the multivibrator 254 and to the resistor 297. The logic low signal from the multivibrator 254 at the output terminal $\overline{Q}$ is utilized to load data representing the number of "incorrect" answers from the "incorrect" up/down counters 252a-252c to the "incorrect" counters 210a-210c.

The operator registers the number of unacceptable answers by momentarily depressing the "incorrect" switch 200, thereby connecting a voltage source (not shown) through a resistor 201 to input terminal D of the "incorrect" flip-flop 202 that also receives a 100 Hz signal from the frequency divider 291. The logic high output signal triggered at the output terminal Q of the flip-flop 202 turns on the "incorrect" indicator lamp 72 through an NPN transistor circuit. This signal from output terminal Q is first applied to the base electrode of an NPN transistor 504 through a resistor 500, wherein the base electrode is also connected to ground through a resistor 502. Transistor 504 has a collector electrode connected to one terminal of indicator lamp 72, while having an emitter electrode connected to the base electrode of an NPN transistor 508. Transistor 508 has a grounded emitter electrode and a base electrode connected to ground through resistor 506, and a collector electrode connected to the collector electrode of transistor 504 and one terminal of indicator lamp 72.

A logic low signal generated at the output terminal Q of the flip-flop 202 is applied to the second input terminal of the OR gate 188 having the second input connected to the terminal Q of flip-flop 184. The output terminal of the OR gate 188 is connected to the "incorrect" counters 210a-210c and the accumulator counters 208a-208c.

The "incorrect" counters 210a, 210b and 210c store BCD data to be transmitted to the respective input terminals of display selectors 220a, 220b and 220c (described above). The information in counters 210a-210c, representing the number of "incorrect" responses, becomes the divisor of the 1MHz input signal connected to the "incorrect" programmable up/down counters 252a, 252b and 252c from the output terminal of the NAND gate 287.

A 1 MHz pulse train is applied to the down input terminal of the counter 252a registering the least significant bit of input data. The "up" input terminal of counter 252a is connected to a voltage source (not shown) through resistor 227. Counters 252a, 252b and 252c are interconnected to operate only in the count-down mode. A borrow pulse, containing information on the number of "incorrect" responses, is transmitted from the most significant bit counter 252c to the input termial T of the multivibrator 254 (described above).

A signal representing a total number of responses at the output terminal of OR gate 188 is applied to the accumulator counters 208a, 208b and 208c. The BCD value stored in each of counters 208a, 208b and 208c is transmitted to a respective display driver 209a-209c, which are individually connected to a voltage source (not shown) through resistors 211a, 211b and 211c. The total number of responses is displayed in the digital displays 213a, 213b and 213c, enabled by their respective display drivers 209a, 209b and 209c. The input signal to the digital displays 213a-213c is generated across resistors 233a-233c connected to a voltage source (not shown).

An aural speech rate device enables an operator to produce a pulse tone of desired frequency for each individual speech therapy student through adjustment of a variable resistor 534, thereby connecting a voltage source (not shown) to the anode electrode of a silicon controlled rectifier 536. A capacitor 538 couples the variable resistor 534 to ground. Also coupled to the anode electrode of the rectifier 536 are resistors 530 and 532, with the former connected to ground and the latter to the voltage source (not shown). The cathode terminal of the rectifier 536 is connected to a speaker (not shown) through a rheostat 540, having a second terminal tied to ground. Also connected to the cathode electrode is a resistor 542.

The operator of the instrument 20 signals the student through the immediate audio feedback system by momentarily depressing the IAF buzzer 430. Momentarily depressing buzzer 430 grounds a voltage source (not shown) through a pull up resistor 431 to generate a drive voltage applied to an NPN transistor circuit through an on/off switch 75 for illuminating the IAF indicator lamp 78. The drive voltage is connected to the base electrode of an NPN transistor 524 through a resistor 520 with the base drive signal developed across a resistor 522 connected to ground. An emitter electrode of the transistor 524 is connected to ground through a resistor 526 and the collector electrode is connected to one terminal of indicator lamp 78.

Direct coupled to the emitter electrode of the NPN transistor 524 is the base electrode of an NPN transistor 528 having an emitter electrode connected to ground. The collector electrode of transistor 528 is interconnected to the collector of transistor 524 and the indicator lamp 78. The second terminal of the indicator lamp 78 is connected to a positive voltage source (not shown).

When an operator momentarily depresses the IAF buzzer switch 430, a signal is also transmitted to a speaker (not shown) through an oscillator circuit. The signal at IAF buzzer switch 430 is applied to one input terminal of NAND gate 433, having a second input terminal clamped to its output by a clamping resistor 438. The output of NAND gate 433 is applied to the two input terminals of a NAND gate 435, having its output coupled by means of a capacitor 439 to the second input terminal of gate 433. NAND gate 435 also drives an input terminal of a NAND gate 434 that receives at a second input terminal a 1 KHz signal from frequency divider 290. The output signal of NAND gate 434 is coupled by means of a capacitor 436 to the speaker (not shown) through a rheostat 437.

As an additional example of utility of the therapy unit 20, let it be assumed that there is a desire to measure indications of vocal weightedness (of the vocal chords) for a certain student. To accomplish this, the formula postulated by Dr. Daniel Boone will be used, namely, VW = (z time/s time), wherein VW is vocal weightedness, z time is the length of time that a student can sustain an even vocalization of the z sound, and s time is the length of time that a student can sustain an even (unvocalized) production of the s sound. With the unit 20, it is particularly easy to determine this important value in establishing a baseline for a student, as well as monitoring his progress. This is accomplished as follows. The clock 24 is first set at zero and in the countup mode. The student is then told to make the z sound; as he begins to make the sound, as he begins to make the sound, the observer actuates one of the switches which starts the clock 24 counting. When the student runs out of breath and ceases to make the z sound, the observer will stop the clock 24. For purposes of illustration, it will be assumed that the z time for this student was 0.03 minute, so the numerals "00.03" will be displayed on the readout means 26. The observer should then manually cause the "3" to be put into the first memory by pressing button 218 three times.

The clock 24 is then cleared by pressing the reset button 150. The student is then instructed to make the s sound and hold it as long as possible, and the start/stop button 100 is pressed at the beginning and conclusion of his performance. It will be assumed that the duration of the s sound is 0.18 minute. To quickly arrive at the value of VW, and hence determine if there appears to be a problem of vocal weightedness, the observer would then press the button 200 for an appropriate number of times, until the display 62 corresponds numerically with the time manifested on the display 26. That is, the button 200 would be pressed 15 times, causing the cumulative memory to display the numerals "18" on display 62. The percentage display 66 would then automatically manifest the quotient (3/18) that constitutes the desired indicator of vocal weightedness, without any further action by the observer.

Still another manner of using the speech therapy unit 20 involves utility of the speech rate unit 80. Let it be assumed that a clinician is desirous of helping a stuttering person achieve full speech fluency. She would first select reading material that the person can read easily, so as to establish a fluency baseline in reading, i.e., how many "blocks" (or incidents of inappropriate speech hesitations, repetitions, prolongations, etc.) typically occur in a given time period, e.g., 5 minutes; also, a fluency baseline in conversation would be established. These two baselines are typically established by setting the clock 24 at, say five minutes, in the countdown mode; the alarm would typically be turned ON, so that the clinician would not have to divide her attention between the student and the passage of time. Indeed, it is physically impossible for a clinician to obtain accurate test results when she must divide her attention between a student and a watch or the like, since many "blocks" are silent; that is, there may be lip movement, jaw movement, eye blinks, etc., which would not be observed by the clinician if she had to concentrate on a watch. (It is probably for this very reason that most clinicians have abandoned their stop watches, because they know that their test results are not valid when they have to watch the student as well as monitor time.) With the clock running, the clinician would count "blocks" in the speech of the stuttering student, with each block being recorded simply by pressing either the "correct" or "incorrect" button (since only a simple counting function is involved at this time, not a discriminating function). Preferably, the recording of blocks is done silently and inconspicuously with the remote control box 68, so that the stutterer need not even be aware that he is being tested; of course, the indicator lights 70, 72 would be switched OFF for this "blind" testing. In some cases, it may be advantageous to keep the entire instrument concealed within a desk drawer—if the student seems to be distracted by the device 20. There is the further need to establish what is defined as a "fluency threshold"; this newly discovered "threshold" is the speed of utterance that a student can tolerate with 100 percent fluency, i.e., how fast he can speak before "blocks" begin to appear. This "threshold" will typically be established as soon as the student has some familiarity with the instrument.

Having established the two baselines (for reading and conversation), the clinician would then normally adjust the speech rate unit 80 to its lowest rate, i.e., a setting of "1". Also, the clock 24 will be set for a short period (e.g., two minutes) of countdown time, by initial manipulation of the thumb wheels of selector means 28 and appropriate closing of switch 160. The student would then be instructed to speak the words contained on a prepared list, at the rate of one vowel or syllable per beat. Typically one syllable words would be "ate, eat, hi, on, his, owe, who;" typical two syllable words would be "easy, ever, many, enter, upon," etc.

The setting of "1" on the scale of 1-10 provided by knob 82 is established to provide a beat at the rate of about 23 beats per minute, i.e., one beat for each 0.043 minute. This rate is much slower than commercially available "music" metranomes or other so-called pacing metranomes. That is, the slowest metranome that is known to be commercially available will produce a minimum of 40 beats per minute, which may well be above the fluency threshold for the student. Hence, a student's low threshold could not even be measured; and, it would be impossible to predict achievement of 100% fluency during training.

In view of the discovery that there is a fluency threshold, it will perhaps now be appreciated why such a slow beat rate is provided in the unit 80. That is, the slow beat rate is to insure that the stuttering person will be capable of complete speech fluency when he paces himself at uttering one syllable in the interval between two beats. (The student will have been instructed at the beginning of a program to start his first syllable when he first hears a beat, and to terminate his utterance of that syllable when he hears the next beat, and to immediately begin his next syllable.) The beats themselves are very short, lasting only long enough to be discerned—and certainly not so long as to interfere with the speech pacing. A preferred beat duration is 0.1 second, or 0.0016 minute. With the clinician initially setting an example of syllable pacing, and the student imitating the clinician, the student will soon learn to pace his speech appropriately. A clinician would then be prepared to begin training at any time by starting the clock 24 for a preset countdown period of, say, 2, 3, or 5 minutes. The silent operation of the clock and the switches is particularly significant, since the success of most any therapy program will be directly related to the concentration that the student brings to bear on his work. That is, when a clinician is striving to modify an intricately delicate neuromotor function (such as occurs in speech), it is critically important that these neuromotor impulses not be altered by irrelevent stimuli or distractions. Once the student has achieved full fluency for a given time period at a pace setting of "1", the rate control 82 would probably be moved by the clinician to "2". In some cases, it may be desirable that the actual rate of produced beats change very little (or even not at all) when the knob is moved from "1" to "2". This slow progress of beat rate increase at the low end of the range has been found to be advantageous from a psychological point of view, since it is important for the student who normally stutters to sense some degree of accomplishment as he speaks; eventually his accomplishment will be reinforced to the extent that he knows that he can speak without stuttering if only he will speak slowly.

Moving the knob 82 to a speech rate of "3" will typically shorten the time between sequential beats to, say, about 0.041 minute. A representative set of pacing values for a typical speech therapy unit is given in the table below:

| Control 82 Setting | Beats Per Minute | Approximate Time Between Beats, Minute |
|---|---|---|
| 1 | 23 | .043 |
| 2 | 23 | .043 |
| 3 | 24 | .041 |
| 4 | 26 | .038 |
| 5 | 31 | .032 |
| 6 | 38 | .026 |
| 7 | 47 | .021 |
| 8 | 63 | .016 |

-continued

| Control 82 Setting | Beats Per Minute | Approximate Time Between Beats, Minute |
|---|---|---|
| 9 | 90 | .011 |
| 10 | 177 | .005 |

As soon as the student has been taught the technique of speech pacing, he will be ready to continue his training wth the beat tones directed to him privately through the earphones. The privacy which is made possible when earphones are worn by a student is particularly advantageous when more than one student is being trained, but it is obvious that both the clinician and the student must be able to auditorily monitor the beats during the initial portion of a therapy program. Hence, a pacing device that can only be heard by one person is inherently deficient in therapy—since there would be no way for the clinician to known that the student is pacing in unison with the beats. After the student has mastered the ability to fluently speak a given set of words, phrases, etc., then the clinician would gradually accelerate the beep rate by turning control knob 82—being careful not to take the student beyond his "fluency threshold". As training continues, students learn to maintain fluency at socially acceptable speech rates. Eventually, it will be possible to have the student practice the rate control that he has learned without the aid of the pacing beats, and the volume control 84 is particularly advantageous in gradually effecting the transition to self-controlled speech. Experience has shown that most students have learned to quickly incorporate the new, smooth speech patterns into their social conversation, even outside of the actual therapy setting. It is interesting to note that secondary symptoms or mannerisms often associated with stuttering (e.g., blinking, muscle spasms, etc.) spontaneously disappear once rate control is established. Hence, no therapy need be directed to solving these associated "problems".

Still another advantage of the speech thereapy unit 20 is that a student will frequently learn—after just a few hours of training—to manage his own training sessions, whether the clinician is present or not. In this regard, speech therapy with the unit 20 may be considered to be somewhat analogous to a student learning how to play the piano—in that practice sessions help the student master material which was initially presented by the teacher. In fact, most students who are 10 years of age or older are able to set their own goals, and to design some of their own practice material to reach those goals—with much less direct clinical supervision time than is possible using traditional therapy methods.

While only one embodiment of the invention, together with modifications thereof, has been described in detail herein and shown in the accompanying drawings, it will be evident that various further modifications are possible without departing from the scope of the invention.

What is claimed is:

1. Apparatus for recording the performance of an individual student responding to a test environment, comprising in combination:
    operator control means including first and second selector means, with said first selector means being for generating a "correct" signal in response to an operator's manual input that the student has given an acceptable reply, and said second selector means being for generating an "incorrect" signal in response to an operator's manual input that the student has given an unacceptable reply, first counter means connected to said first selector means to record the quantity of "correct" signals generated by said first selector means, second counter means responsive to said first and second selector means to record the quantity of both "correct" and "incorrect" signals which are generated by said first and second selector means, so as to count the total number of input signals, first circuit means responsive to said first and second selector means to also record the quantity of "correct" and "incorrect" signals which are generated by said first and second selector means, display means for continuously indicating the percentage of "correct" signals generated for the recorded quantity of both "correct" and "incorrect" signals, and second circuit means response to said first counter and connected to said first circuit means and said display means for transferring to the display means from the first circuit means a signal representing the percentage of "correct" signals.

2. Apparatus for recording the performance of a student as set forth in claim 1 including first indicator means connected to said first selector means for indicating when a "correct" signal has been generated.

3. Apparatus for recording the performance of a student as set forth in claim 2 including second indicator means connected to said second selector means for indicating when an "incorrect" signal has been generated.

4. Apparatus for recording the performance of a student as set forth in claim 1 including second display means connected to said first counter means and said first circuit means for selectively indicating the quantity of "correct" signals generated by said first selector means or the quantity of "correct" and "incorrect" signals recorded in the first circuit means.

5. Apparatus for recording the performance of a student as set forth in claim 1 including third display means connected to said second counter means for indicating the accumulated quantity of "correct" and "incorrect" signals which have been generated by said first and second selector means.

6. Apparatus for recording the performance of a student as set forth in claim 1 wherein said operator control means includes a reset selector means for resetting to zero the quantity of "correct" signals in said first counter means and the quantity of "correct" and "incorrect" signals recorded in said first circuit means.

7. Apparatus for recording the performance of a student as set forth in claim 6 including means for clearing the second counter means of the recorded quantity of "correct" and "incorrect" signals.

8. Apparatus for recording the performance of a speech therapy student who is responding to a test environment, comprising in combination:

operator control means including a first switch for generating a "correct" signal in response to an operator input that the student has given an acceptable performance, and a second switch for generating an "incorrect" signal in response to an operator input that the student has given an unacceptable performance, counter means connected to said first switch to record the quantity of "correct" signals generated by said first switch, first circuit means responsive to said first and second switches to record the total quantity of "correct" and "incorrect" signals which are generated by said first and second switches, display means for indicating the percentage of "correct" signals generated for the recorded quantity of "correct" and "incorrect" signals, and second circuit means responsive to said counter means and connected to said first circuit means and said display means for transferring to the display means from the first circuit means a signal representing the percentage of "correct" signals immediately following the input of any signal by said first and second switches.

9. Apparatus for recording the performance of a student as set forth in claim 8 including first indicator means connected to said first switch for indicating when a "correct" signal has been generated.

10. Apparatus for recording the performance of a student as set forth in claim 8 including second indicator means connected to said second switch for selectively indicating when an "incorrect" signal has been generated.

11. Apparatus for recording the performance of a student as set forth in claim 8 including second display means connected to said counter means and said first circuit means for selectively indicating the quantity of "correct" signals generated by said first switch or the quantity of "correct" and "incorrect" signals recorded in the first circuit means.

12. Apparatus for recording the performance of a student as set forth in claim 8 including reset means for resetting to zero the quantity of "correct" signals in said counter means and the quantity of "correct" and "incorrect" signals recorded in said first circuit means.

13. Apparatus for monitoring the testing of a student in a preselected time interval, comprising in combination:

display means including a time display for indicating the minutes and portions thereof in a selected time interval, and an answer recording display for indicating the "correct" signals generated in response to an operator input, means for presetting said time display with a count representing an initial level from which elapsed time will be measured either increasing from the count level or decreasing therefrom, a selector switch interconnected to said time delay to establish either an increasing count mode or a decreasing count mode for said time display, a start/stop switch connected to said time display for controlling the operation thereof, means for generating the "correct" signals and the "incorrect" signals in response to an operator's input, the latter being generated in response to an operator input that the student has given an unacceptable reply, and for generating a percentage of "correct" signals in comparison with the quantity of "correct" and "incorrect" signals, means for accumulating the "correct" signals and the "incorrect" signals, and means for connecting said means for accumulating to the answer recording display of said display means.

14. Apparatus for monitoring the testing of a student as set forth in claim 13 including means for generating an audible pulse signal at a preferred answer rate.

15. Apparatus for monitoring the testing of a student as set forth in claim 14 including means for manually actuating an audible alarm during the testing of a student.

16. Apparatus for monitoring the testing of a student as set forth in claim 15 including a first indicator lamp energized when said time display counts down to zero in a countdown mode from the initial preset level.

17. Apparatus for monitoring the testing of a student as set forth in claim 16 including an alarm connected to said time display and actuated when said time display counts down to zero in the countdown mode from the initial preset level.

18. Apparatus for monitoring the testing of a student as set forth in claim 16 including a "correct" indicator lamp energized in response to a generated "correct" signal and an "incorrect" indicator lamp energized in response to a generated "incorrect" signal.

19. Apparatus for monitoring the testing of a student as set forth in claim 18 including a remote operator station connected to said answer recording display and including means for generating the "correct" signals and second means for generating the "incorrect" signals.

20. Apparatus for monitoring the testing of a studemt as set forth in claim 19 wherein said remote operator station further includes means connected to said time display for controlling the operation thereof.

21. Apparatus for monitoring the testing of a student as set forth in claim 20 wherein said remote operator station further includes means for manually actuating said audible alarm.

* * * * *